United States Patent [19]

Kuster

[11] Patent Number: 5,339,537
[45] Date of Patent: Aug. 23, 1994

[54] CONTINUOUS DRIER FOR FLAT PIECE MATERIAL

[75] Inventor: Kaspar Kuster, Basel, Switzerland

[73] Assignee: Ciba-Geigy Corporation, Ardsley, N.Y.

[21] Appl. No.: 973,469

[22] Filed: Nov. 9, 1992

[30] Foreign Application Priority Data

Nov. 14, 1991 [DE] Fed. Rep. of Germany ..... 91810881

[51] Int. Cl.$^5$ ............................................. F26B 13/00
[52] U.S. Cl. ....................................... 34/612; 34/189; 198/607; 198/612
[58] Field of Search ................. 34/149, 189, 190, 151, 34/162, 163; 198/607, 611, 612

[56] References Cited

U.S. PATENT DOCUMENTS

| | | | |
|---|---|---|---|
| 864,493 | 8/1907 | Swift, Jr. | 34/149 |
| 1,692,294 | 11/1928 | Elder . | |
| 1,736,866 | 11/1929 | Wagner et al. | 198/134 |
| 4,058,908 | 11/1977 | Weber | 34/149 |
| 4,390,093 | 6/1983 | Chard, Jr. et al. | 198/654 |
| 4,614,045 | 9/1986 | Nagasawa et al. | 34/149 |

FOREIGN PATENT DOCUMENTS

| | | |
|---|---|---|
| 672267 | 3/1966 | Belgium . |
| 448186 | 8/1927 | Fed. Rep. of Germany . |
| 1604944 | 4/1970 | Fed. Rep. of Germany . |
| 574761 | 1/1946 | United Kingdom . |

Primary Examiner—Denise Gromada
Attorney, Agent, or Firm—William A. Teoli, Jr.

[57] ABSTRACT

A continuous drier for flat piece material, especially for liquid-coated printed circuit boards, and the like, comprises a heatable drier housing and a transport path that ascends in the housing and, after passing an upper turning point descends again. Secured to an endless chain that extends substantially vertically are carriers for the piece material to be transported, which carriers project outwards from the endless chain. The drier also comprises a supply duct for drying air for the piece material to be dried. The supply duct is so arranged that an airstream supplied by it flows over the piece material transversely to the direction in which the carriers project from the chain links.

10 Claims, 9 Drawing Sheets

CONTINUOUS DRIER FOR FLAT PIECE MATERIAL

The invention relates to a continuous drier for flat piece material, especially for liquid-coated printed circuit boards and the like, according to the preamble of patent claim 1.

Continuous driers of that type are well known and, for example, in the case of printed circuit board processing, are already in industrial use. Such a known continuous drier is described, for example, in DE-A-3 239 868. In the case of the drier described therein, the piece material to be dried, which may be, for example, a printed circuit board liquid-coated on its upper side, runs horizontally into a run-in station of the drier. That can be effected, for example, on a roller conveyor that describes a horizontal run-in path. In that run-in station, the lower side of the printed circuit board is taken by a carrier connected to an endless chain conveyor, and is lifted upwards from the roller conveyor by means of the carrier. The chain conveyor, to the chain of which many such carriers are secured, describes a closed circulating path, part of which is used as the transport path for the individual printed circuit boards. The printed circuit board lifted from the run-in roller conveyor by means of such a carrier is first transported upwards until it reaches an upper turning site at which the chain is turned round and guided downwards again. Accordingly, after the carrier has been turned round, the printed circuit board also is guided downwards again. When the downwardly guided carrier carrying the printed circuit board passes below a certain level at which is arranged a run-out station having a horizontally extending run-out roller conveyor for the boards, the printed circuit board remains on that run-out roller conveyor while the carrier moves further downwards. The board resting on the run-out roller conveyor is transported out of the run-out station before the next carrier coming down from above reaches the level of the run-out roller conveyor. The now unladen carrier is guided further downwards, turned round at a lower turning site, guided upwards again, lifts another printed circuit board from the run-in roller conveyor in the run-in station and the same cycle begins again.

When, at the beginning of its transport by means of the carrier, the board has been lifted from the run-in roller conveyor, it passes in the course of its upward transport out of the lower housing portion, in which both the run-in station and the run-out station are provided, into the upper housing portion of the drier. That upper housing portion is provided with a base separating wall that separates the upper housing portion from the lower housing portion, with the exception of the openings that have to be provided for the already described transport mechanism (chain conveyors with carriers which carry the printed circuit boards) and the boards that rest thereon. The separation of the housing portions is primarily for the purpose of thermal separation: while the printed circuit board, on its transport path, is located in that upper housing portion, in order to dry it heated air is conveyed over the board in accordance with DE-A-3 239 868 in such a manner that the airstream is conveyed over the board in the direction in which the carriers project from the chain of the chain conveyor during their upward movement and counter to the direction in which the carriers project from the chain of the chain conveyor during their downward movement. For that purpose, the air is supplied to the upper housing portion substantially from the side on which the run-out station is arranged and is removed by suction again on the side on which the run-in station is arranged. When, after passing through the upper housing portion, the board reaches the run-out station, it is cooled again by the considerably lower temperature prevailing there.

Although that drier and other similar driers belonging to the prior art are in principle functionally efficient, they nevertheless still have disadvantages in need of correction. First of all, in the case of such driers, the boards to be dried have usually already been subjected to vapour-removal, that is to say, a considerable proportion of the solvents contained in the coating composition, for example a solder varnish, has already been removed before the actual drying operation so that the drying of the coated board in the drier is sufficient. That generally requires a vapour-removal station to be arranged upstream of the drier, which station firstly involves additional technical outlay and considerable additional costs and, secondly, separate space. A further disadvantage of known driers is the manner in which the carriers, the so-called "racks" which transport the boards through the drier, are constructed and secured to the transport chain. EP-A-0 070 805 has already pointed out the problem that the individual links of the chain, or the connecting pins of the individual links of the transport chain, are loaded very unevenly if the individual racks are not secured exactly in the middle of the associated link and, in addition, if they are not loaded approximately evenly. Furthermore, in the case of the driers known hitherto, the racks are generally in such a form that two consecutive racks have to be at a relatively great distance from each other so that the teeth of consecutive racks, or the racks themselves, cannot obstruct one another. As a result, the capacity of the drier, or the "packing density" at which the boards can be transported one after another through the drier, may be considerably restricted. Another disadvantage is the method of airstream supply described in DE-A-3 239 868, which can lead to uneven and often inadequate drying of the coated boards. Therein, the airstream is conveyed over the boards to be dried in the direction, or counter to the direction, in which the racks project from the chain. In DE-A-3 239 868, that problem is solved by supplying the air on the side where the descending transport path is located, that is to say, by conveying it first over the downwardly transported boards and then over the upwardly transported boards on the side where the ascending transport path is located, before then removing it again by suction on the side where the ascending transport path is located. In other words, the drying air is conveyed along a relatively long path over several boards before it is removed by suction again. Considerable unevenness and fluctuations in the drying airstream, for example swirling effects, etc., may result along such a relatively long air-path, which may give rise to uneven or also insufficient drying of the boards.

The problem of the invention is accordingly to propose a continuous drier in the case of which those disadvantages are eliminated, that is to say, a continuous drier which renders possible, especially, a comparatively short air-path and thus an even airstream over the boards to be dried. In addition, the drier is to permit a high packing density of boards to be dried without consecutive racks obstructing one another. Furthermore, it is to be possible to carry out the vapour-removal and drying operations in one and the same apparatus in order to save space.

That problem is solved according to the invention in that the supply duct for the drying air is so arranged that an airstream supplied by it flows over the piece material transversely to the direction in which the carriers project from the chain links. As a result, the air-path can be kept short and the airstream can be conveyed evenly over the board concerned so that it is ensured that the board is dried well.

In one arrangement of the drier according to the invention, the supply duct is arranged laterally adjacent to the transport path for the piece material and is integrated in the drier housing. In an especially advantageous arrangement of the drier, the airstream is conveyed over the piece material to be dried through slots formed between consecutive carriers.

In order to permit a high packing density of boards to be dried, in a further arrangement of the drier according to the invention each of the carriers secured to the links of the chain comprises two lateral bars which at their base ends, which face the chain, are connected to each other by a connecting strip. Secured to the lateral bars are substantially V-shaped carrying members, of which the vertices point approximately in the direction of the carrying members on the other lateral bar. Of the two ends of those V-shaped carrying members, one is secured to the upper side and the other is secured to the lower side of the associated lateral bar.

In a development of the drier according to the invention, a carrier is secured to each link of the transport chain. Each of the two lateral bars of a carrier has an approximately U-shaped profile, of which the arms point towards the other bar. The carrying members are so connected to the lateral bars that one end of a carrying member is secured to the outer wall of one arm of the U and the other end is secured to the inner wall of the other arm of the U of the lateral bar concerned. The width of the lateral bars together with the thickness of the carrying members does not exceed the length of a link of the transport chain. That development is also advantageous with regard to a high packing density of boards to be coated because it enables two consecutive carriers to follow each other as closely as possible, the consecutive carriers being maintained at a distance from each other by the end of the carrying members that is secured to the outer wall of the arm of the U. In addition, owing to the distance between consecutive carriers, the liquid-coated face of a board cannot be damaged by a following carrier. Finally, it is also necessary for there to be a gap between two carriers in order to be able to convey the airstream over the board to be dried. In order, if possible, to provide each chain link with a carrier, the width of a lateral bar together with the thickness of the carrying members must not exceed the length of a chain link.

In a variant of the drier according to the invention, the transport path comprises two triplex chains each of which is formed by three interconnected link conveyors circulating parallel to one another. The outermost link conveyor circulates in a guideway and serves to guide the whole triplex chain. At the other two link conveyors, the carriers are connected in an alternating manner to the middle link conveyor of the one triplex chain and, at the same time, to the innermost link conveyor of the other triplex chain, so that each chain link is occupied by a carrier. At the same time, providing the chains with carriers in that manner enables tensile and compressive forces, or the moments acting on the connecting pins of the individual chain links, to compensate for each other, thereby stabilising the whole "rack packet" and loading the chain to a considerably lesser extent than it would be if the forces or the moments were to act additively on the chain.

In an advantageous arrangement, support strips for the piece material are arranged near the base ends of the lateral bars and each extends between two consecutive lateral bars of two carriers to the associated, opposite lateral bars. Those support strips are provided so that the piece material in the form of the board can be supported against them, especially as they are being turned round.

In order first to pre-heat the board and then to bring it slowly back to the ambient temperature after passing through the hottest drying zone, several zones are provided in the drier housing which are heated to different temperatures and are thermally separated from one another. A separate supply duct for drying air is provided in each temperature zone. The temperature zones thus comprise a pre-heating zone in a first portion of the transport path, in which zone the temperature is, for example, in the range of approximately from 30° to 70° C., a subsequent, hot-air zone in which the temperature is, for example, in the range of approximately from 80° to 110° C. and a final, cooling zone in which the temperature is, for example, in the range of approximately from 15° to 30° C.

The temperature zones are separated from one another by separating walls that extend from the lateral body of the housing as far as the lateral bars. The walls are provided with lip-like seals past which the lateral bars of the carriers are conveyed so that the lateral bars, in co-operation with the lip-like seals, bring about the thermal separation of the individual temperature zones from one another.

The invention is explained in more detail in the following with reference to the drawings, some of which are schematic.

Figure 1:
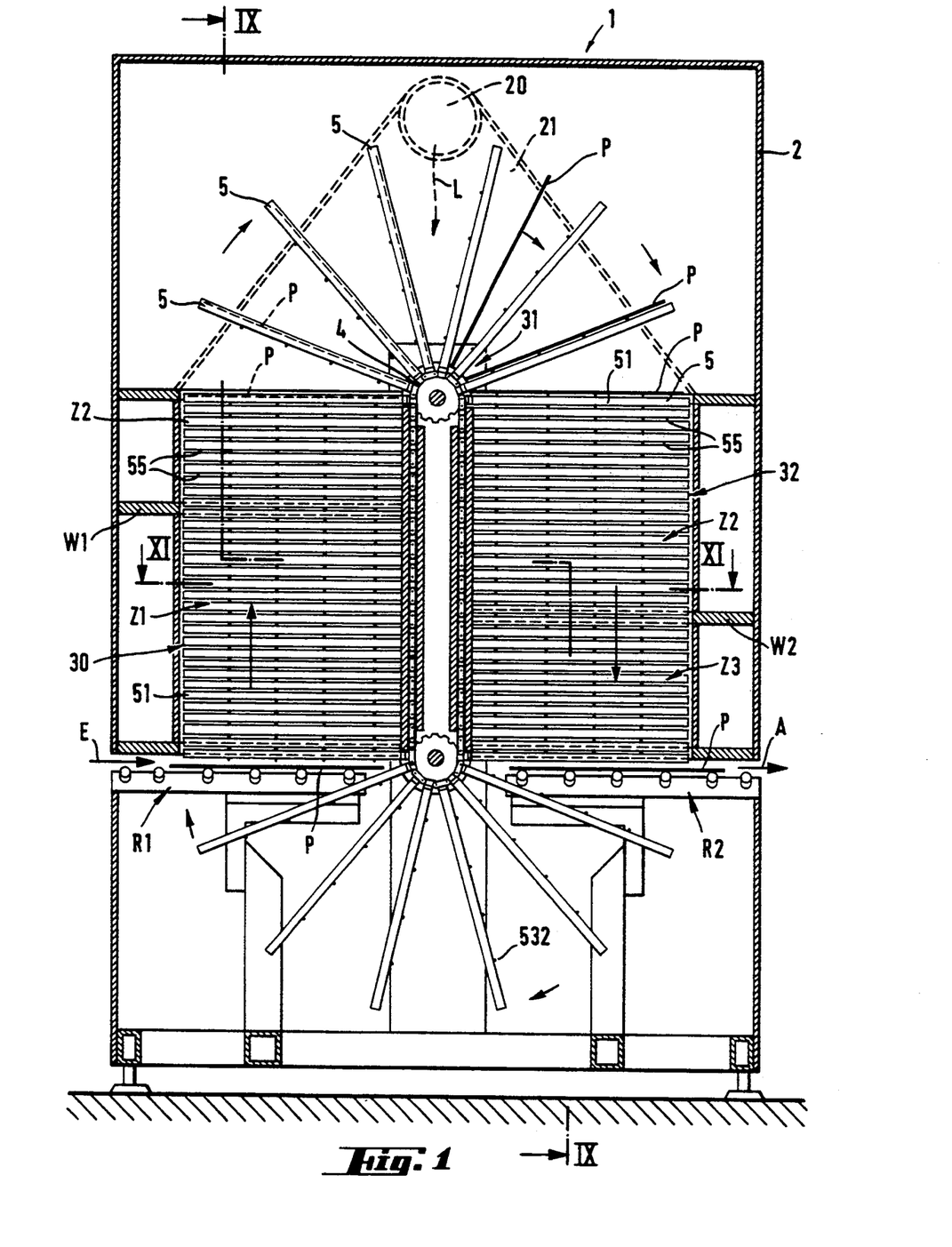
FIG. 1 shows an embodiment of the continuous drier according to the invention in longitudinal section.

The embodiment of the continuous drier 1 according to the invention shown in FIG. 1 comprises a drier housing 2 with an ascending transport path 30 and a transport path 32 descending again after the upper turning point 31. The transport path comprises an endless chain 4 that extends substantially vertically and to which carriers 5 for an article of piece material to be dried, for example a board P, are secured. The carriers 5 project outwards from the endless chain 4. The continuous drier also comprises a supply duct 21 for drying air which is not shown here for reasons of draughtmanship (see FIG. 9).

The embodiment of the drier shown in FIG. 1 functions roughly as follows: a board P to be dried is conveyed to the drier; for example, the board can run into the drier on a roller conveyor R1 in the direction of arrow E. A carrier 5 coming from under that roller conveyor R1, which carrier is secured to the endless chain 4 and is moved together with that chain 4, lifts the board P to be dried from the roller conveyor R1 and transports it upwards. In order to facilitate the loading of a carrier, the drive of the chain 4 can be interrupted, the board P can run into the drier on the roller conveyor R1 in the direction of arrow E and then the chain 4 can be driven again so that the carrier 5 coming from under the roller conveyor R1 then lifts the board P from the roller conveyor R1. The preferred construction of the carriers 5 will be explained in detail hereinafter. An explanation will also be given as to the manner in which the board P rests on the carrier 5 during transport through the drier.

The carrier 5 transports the board P upwards as far as the turning point point 31. On passing the turning point 31, the transported board P flips over in the forward direction and rests, during the subsequent downward transport, on the preceding carrier. When the carrier 5 moving downwards, with the board P resting on it, reaches the level of a roller conveyor R2, the carrier 5 is moved further downwards but the board P remains on the roller conveyor R2 on which it is then transported out of the drier in the direction of arrow A. The removal of the board P on the roller conveyor R2 is carried out before the subsequent carrier coming from above reaches the level of the roller conveyor R2. That can be achieved, on the one hand, by giving the roller conveyor R2 a sufficiently high transport speed that the endless chain 4 can run continuously, or, on the other hand, by interrupting the drive of the endless chain 4 in order to facilitate the removal of the board P, in a similar manner to that applied when the board P runs in, as soon as a board P has passed onto the roller conveyor R2. During that interruption of the drive of the chain 4, the board P can be transported away on the roller conveyor R2 in the direction of arrow A. Overall, the chain 4 can generally also be driven intermittently, and preferably in such a manner that, during an interruption of the drive, both a board P to be dried runs into the drier on the inlet side and, at the same time, an already dried board P runs out of the drier on the outlet side.

During transport through the drier, drying air flows over the board P transversely to the direction in which the carriers 5 project from the chain 4. The drying air flows over the board P in particular perpendicular to that direction, that is to say, according to FIG. 1, either into the plane of the drawing or out of the plane of the drawing. As already mentioned above, that results in a short air-path and evenness of the airstream and is especially advantageous for the drying of the boards.

Figure 2:
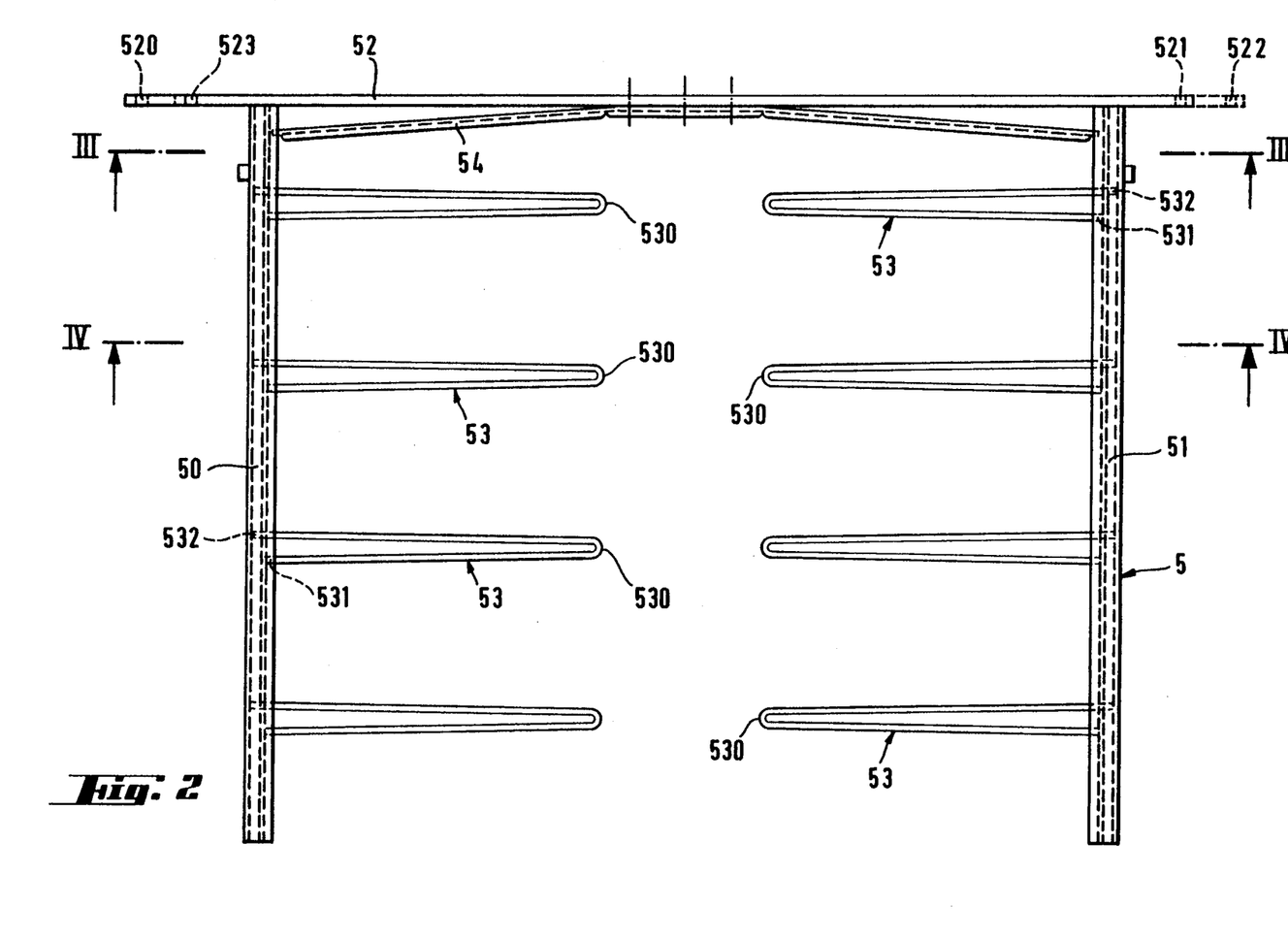
FIG. 2 shows a carrier for the boards to be dried in the assembled state.

In order better to understand the special manner in which the airstream is conveyed, there will first of all be described below an arrangement of the carriers 5 that is especially advantageous because it permits an airstream to be conveyed in that manner and, in addition, is especially advantageous with regard to a high packing density. FIG. 2 shows an embodiment of such a carrier 5 in the assembled state. The carrier 5 comprises two lateral bars 50 and 51 that are connected to each other by a connecting strip 52 at their base ends which, in the mounted state, face the chain 4. Secured to the lateral bars 50 and 51 are carrying members 53 that are substantially V-shaped. The carrying members 53 are so secured to the lateral bar 50 or 51 that their vertices 530 point towards the other lateral bar. Of the ends 531 and 532 of the V-shaped carrying members 53, one is secured to the upper side of the lateral bar 50 or 51 and the other is secured to the lower side of that lateral bar.

Figure 4:
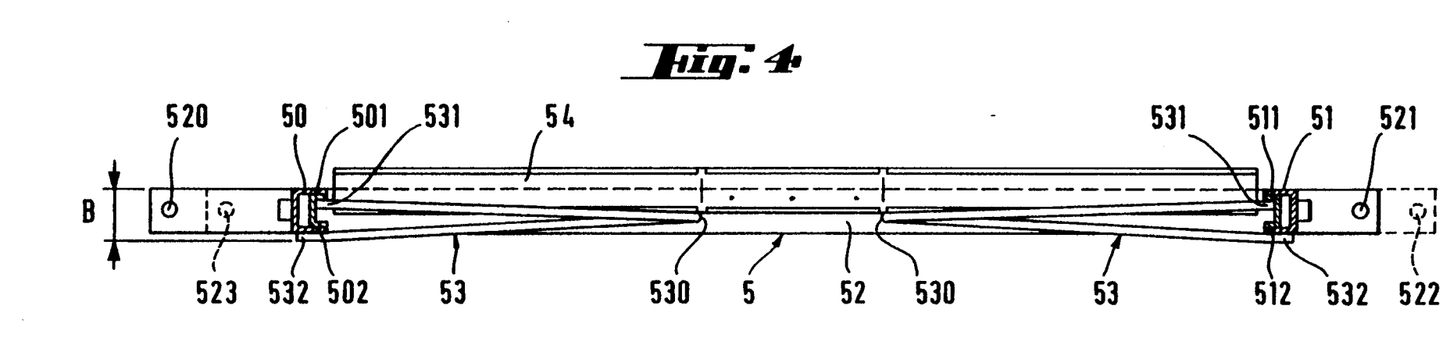
FIG. 4 is a view of the carrier according to the line IV—IV of FIG. 2.
Figure 5:
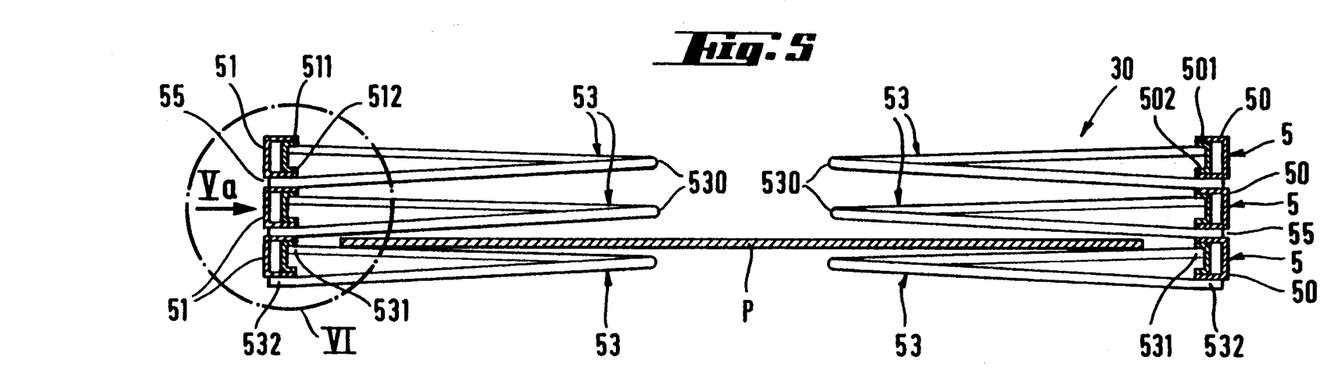
FIG. 5 is a view of three consecutive carriers during the upward transport of the boards.

The manner in which those ends 531 and 532 of the carrying members 53 are respectively secured to the upper side and the lower side of the lateral bars 50 and 51 is shown especially clearly in FIG. 4, which shows a view of a carrier 5 according to the line IV—IV of FIG. 2. There it can be seen that each of the lateral bars 50 and 51 has an approximately U-shaped profile of which the arms 501 and 502 and 511 and 512, respectively, point towards the other lateral bar. For example, the one end 531 of the carrying member 53 is secured to the inner wall of the one arm 501 resp. 511 and the other end 532 of the carrying member 53 is secured to the outer wall of the arm 502 resp. The width B of a lateral bar together with the thickness of the carrying members 53 does not exceed the length of a link of the chain 4. If as great a packing density as possible is to be achieved, the carriers 5 follow one another as closely as possible. In the limiting case, the sum of the width B of a lateral bar and the thickness of a carrying member 53 corresponds exactly to the length of a chain link. The ends 532 of a carrying member 53, which are secured to the outside of a lateral bar, act as spacer members between consecutive lateral bars so that a slot 55 is formed between the consecutive lateral bars (FIG. 5). The drying air which dries the coated boards resting on the carrying members 53 is supplied through that slot.

Figure 3:
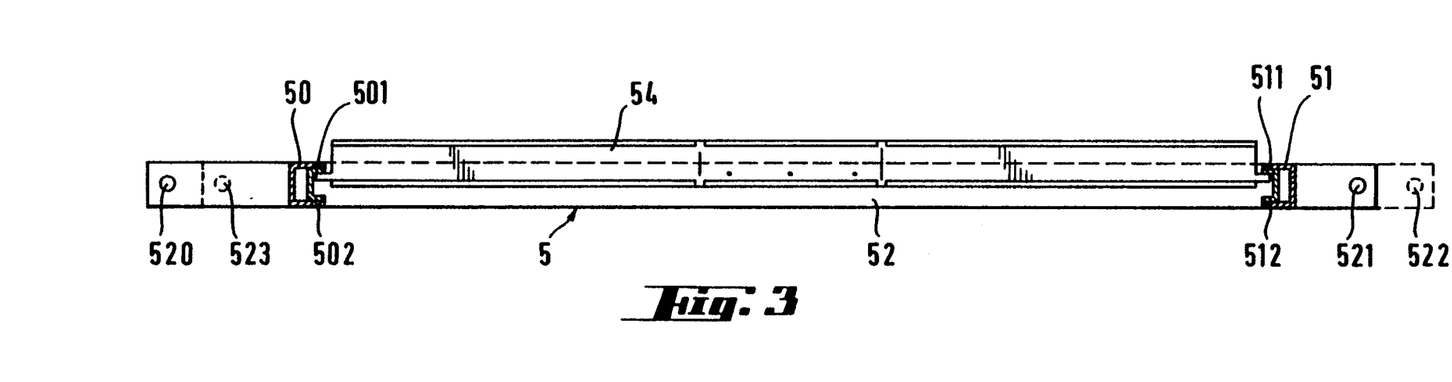
FIG. 3 is a view of the carrier according to the line III—III of FIG. 2.

In FIG. 3, which shows a view according to the line III—III of FIG. 2, it can be clearly seen that there are provided near the base ends of the lateral bars 50 and 51 support strips of which only one support strip 54 is shown in FIG. 3. Each of the support strips 54, which are also shown clearly in FIG. 2, is arranged between two consecutive lateral bars of two carriers and extends from the one lateral bar 50 over to the other lateral bar 51. The transported board P to be dried rests against those support strips 54 especially when the carrier 5 reaches the region of the upper turning point 31 of the transport path.

Figure 5A:
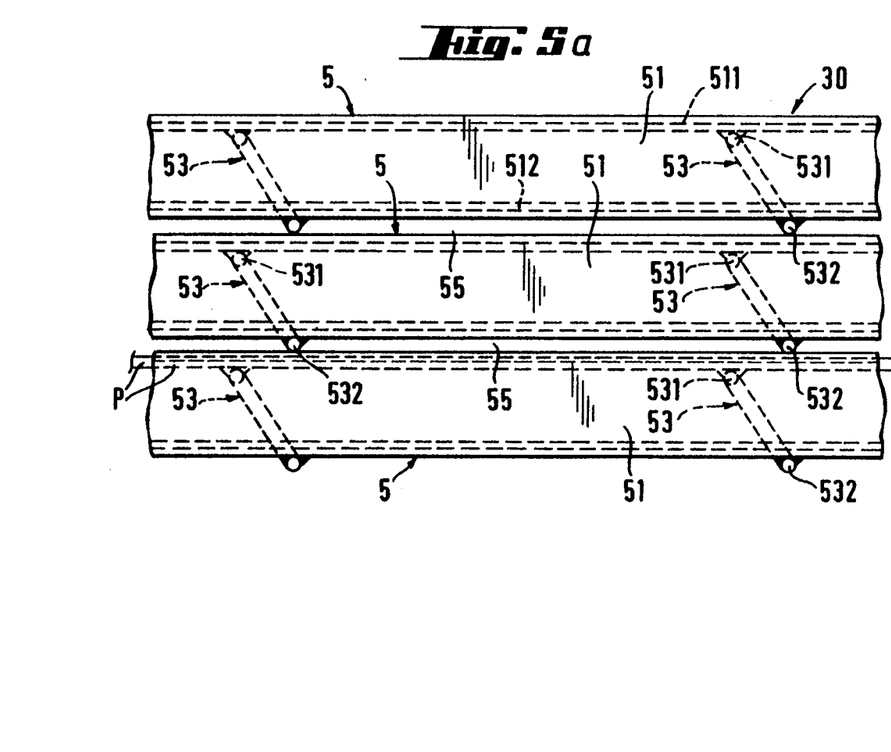
FIG. 5a is a view of the three carriers according to arrow Va in FIG. 5.

So far the carriers 5 have been described without explaining the boards P, which of course rest on the carrying members 53 of the carriers 5. FIG. 5, in which three consecutive carriers are shown during upward transport, shows how the boards P (for reasons connected with draughtmanship, only one board P is shown) rest on those carrying members 53 of the carriers 5. It is also clearly apparent that a very high packing density can be achieved using that arrangement. The basic manner in which the air is conveyed over the board to be dried is shown in FIG. 5a. The "free" ends 532 act as spacer members between two consecutive lateral bars so that the slots 55 are formed. The drying air flows through those slots 55 and over the board P which is also shown. In FIG. 5a, the air flows in a direction either into the plane of the drawing or out of the plane of the drawing.

Figure 6:
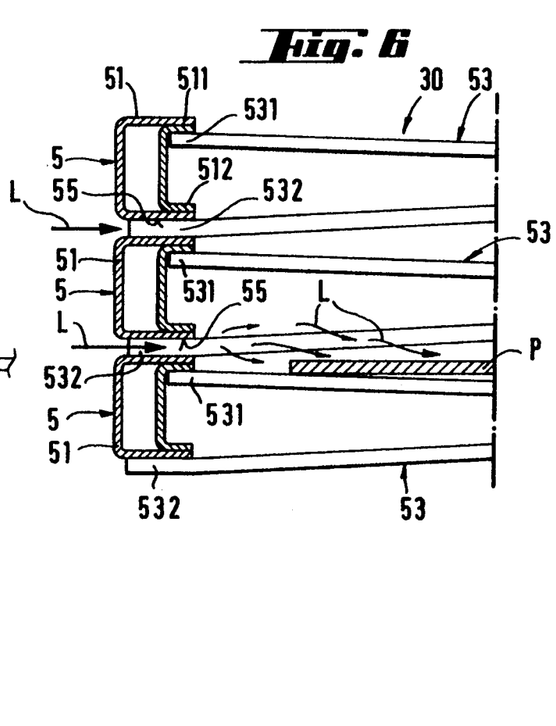
FIG. 6 shows the detail VI of FIG. 5 on an enlarged scale.

The detail VI of FIG. 5 is drawn again on an enlarged scale in FIG. 6. It is clearly shown in that larger-scale representation that the board P rests on the carrying members 53 only on its side borders. Because the coating of the boards P does not generally extend quite as far as their side borders, the board P rests on the carrying members only in an uncoated region. Drying air is supplied through the slots 55 formed by the ends of the carrying members and flows over the board P transversely to the direction in which the carriers 5 project from the chain 4 (see in this connection FIG. 1) and thus dries the board.

Figure 7:
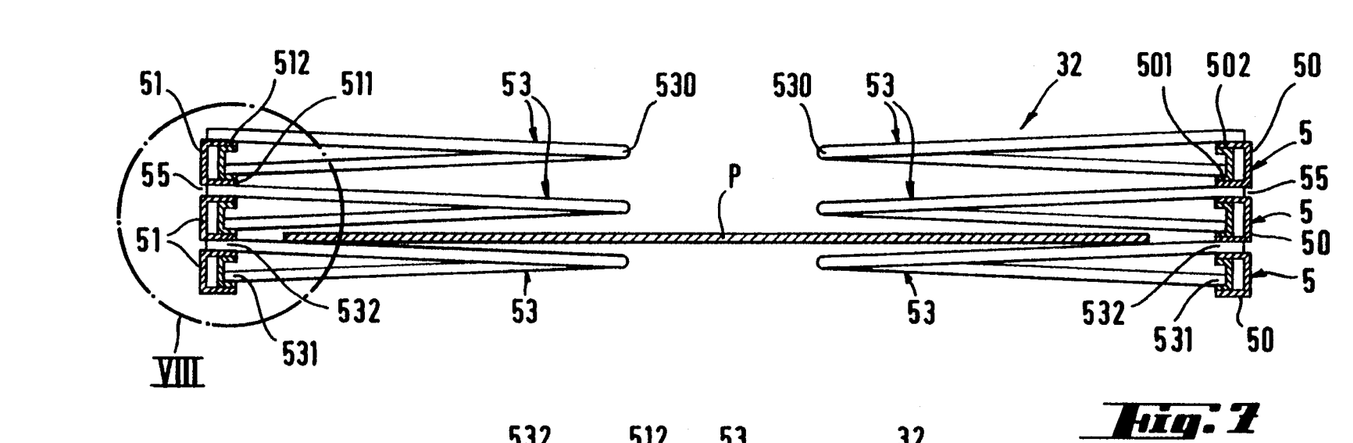
FIG. 7 is a view of three consecutive carriers during downward transport of the boards.
Figure 8:
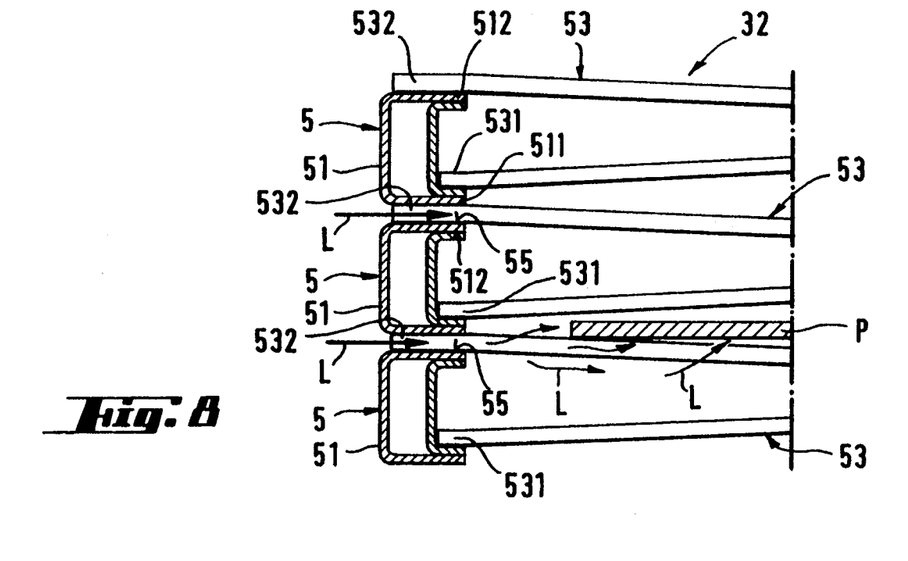
FIG. 8 shows the detail VIII of FIG. 7 on an enlarged scale.

Similarly to FIG. 5, FIG. 7 shows three consecutive carriers, but in this case during downward transport, which can be recognised because, in contrast to the situation during upward transport according to FIG. 5, the board now rests on a carrying member 53 where the end 532 is secured to the outside of the lateral bar 51. As already described, on passing the upper turning point 31 (FIG. 1) the board P flips over onto the preceding carrier. The manner in which the board P rests on the carrying members 53 ensures that the drying airstream always flows over the coated side of the board and that drying is very effective. FIG. 8 shows the detail VIII of FIG. 7 again on an enlarged scale in order to make clear the manner in which the board P rests on the carrying members 53.

After the explanation given above of the manner in which the board is transported through the drier, an explanation will be given in the following of how the airstream is conveyed over the boards P in order to dry them. It has already been mentioned generally in this connection that the airstream is conveyed over the board P transversely to the direction in which the carriers 5 project from the chain 4, thereby permitting a short air-path and an even airstream. To enable the board to be dried especially effectively, zones are provided in the drier housing that are heated to different temperatures. Those zones Z1, Z2 and Z3 have already been shown in FIG. 1. The temperature zones Z1, Z2 and Z3 are thermally separated from one another. A separate supply duct for the drying air is provided in each temperature zone. When the board has run into the drier 1 it passes first into zone Z1 in the first portion of the transport path, which zone may be in the form of a pre-heating zone and in which zone the temperature in the embodiment described here is in the range of approximately from 30° to 70° C. and is, especially, approximately 50° C. The board P then passes into zone Z2 which may be in the form of a hot-air zone in which the temperature is in the range of approximately from 80° to 110° C. and is, especially, approximately 90° C. Finally, the board P passes into zone Z3 which may be in the form of a cooling zone and in which the temperature is in the range of approximately from 15° to 30° C. and is, especially, approximately 25° C. When the board has passed through that zone also, it passes onto the roller conveyor R2, as already explained, and is transported away. It will be understood that the mentioned temperature ranges in the individual zones are to be regarded only as examples and that the temperatures may also lie in a different range, depending on the board material, the coating composition used, etc.

Figure 9:
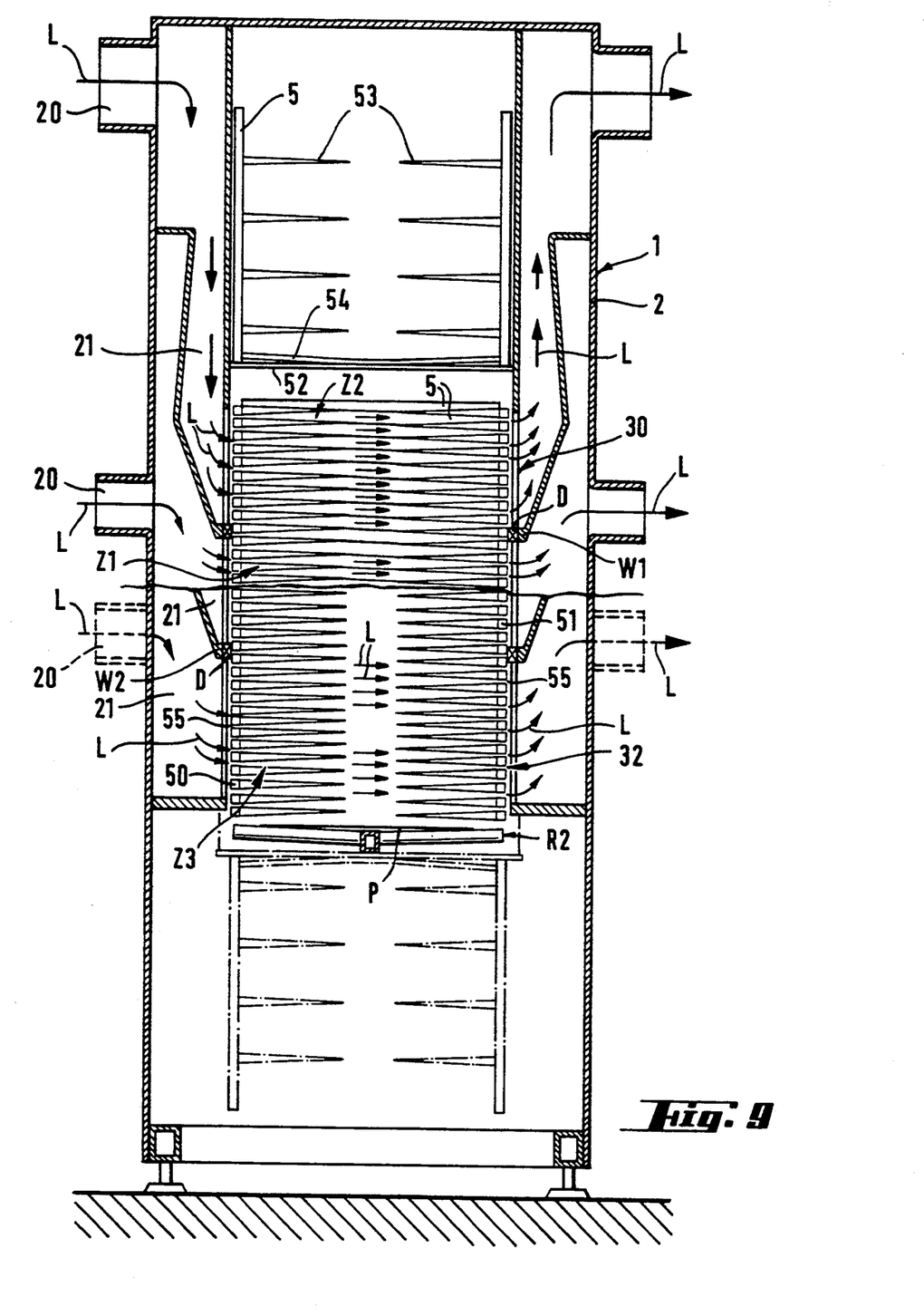
FIG. 9 is a view according to the line IX—IX of FIG. 1.

In FIG. 9, which shows a view according to the line IX—IX of FIG. 1, it can be seen that the individual temperature zones are thermally separated from one another and the Figure also shows the manner in which, for example, the drying air is supplied. The drying air is supplied via the inlet 20, shown merely with a broken line in the lower half of the drier, to which, for example, an air-supply tube (not shown) may be connected. The air flowing in through the inlet 20 flows according to arrows L through a supply duct 21 to the lateral bars of the carriers. The separating walls W1 and W2 (FIG. 1) are provided at their ends that face the lateral bars with lip-like seals D past which the lateral bars of the carriers 5 are conveyed. The air supplied according to arrows L flows through the slots 55 between consecutive carriers 5 and over the board P (see also FIG. 5a), thus drying it. On the other side, the air leaves again through the corresponding slots 55 and is removed. Some of the air removed may be fed back to the inlet or a completely fresh supply of air may be provided. In the embodiment described here, the supply and removal of air is effected in the same manner in the other temperature zones.

Figure 10:
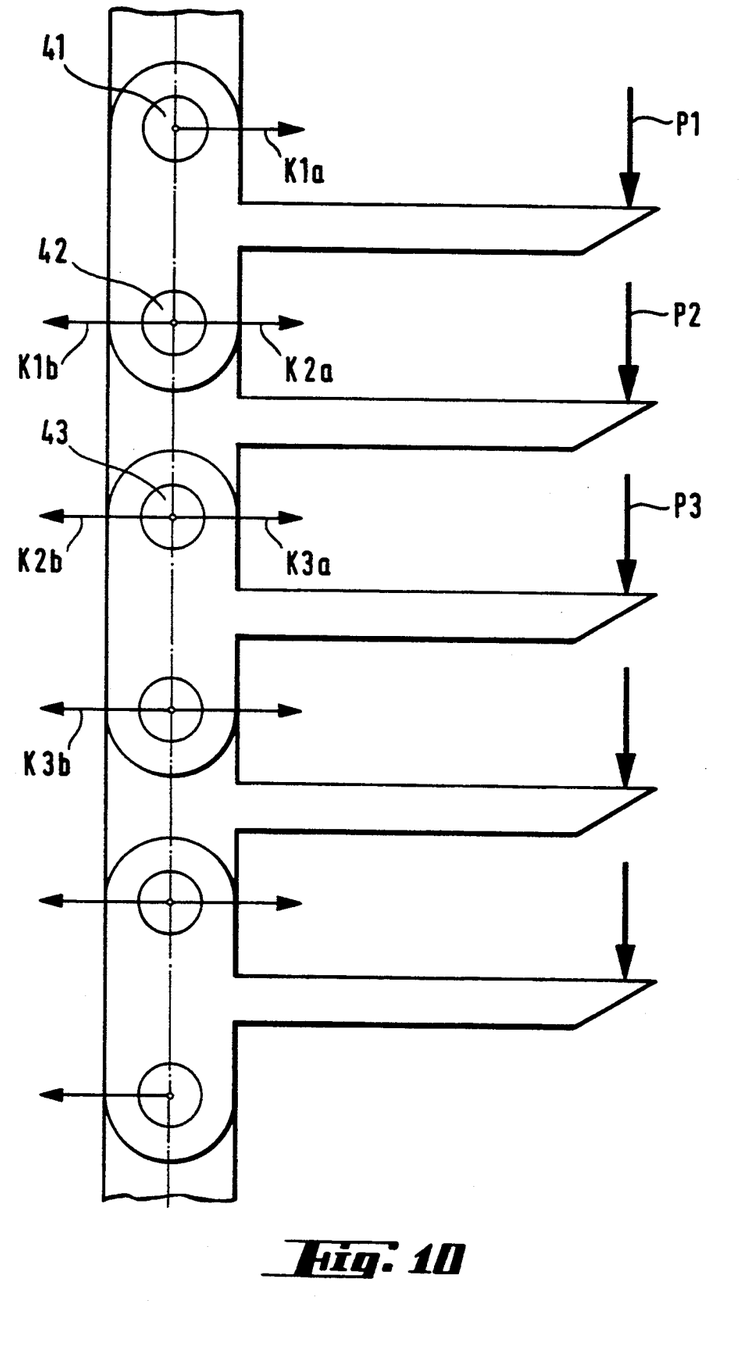
FIG. 10 is a representation in principle of the forces acting on the chain.

In one arrangement of the drier according to the invention, the individual carriers 5 are secured to the chain 4 in a special manner. As already mentioned in the introduction, it is especially desirable to load the connecting pins of the individual links of the chain 4 as evenly as possible so that the chain guideway or the chain links and their connecting pins do not have to absorb all of the forces or moments. Attention has already been drawn to this in principle in EP-A-0 070 805. This will be explained again in principle with reference to FIG. 10. A board P resting on a carrier presses on that carrier by its own weight according to arrow P1. As a result, a force acts on the connecting pin 41 of the chain 4 in the direction of arrow K1a. By the agency of the same board, a force acts on the connecting pin 42 in the direction of arrow K1b. The same considerations apply to forces that act on the connecting pins 41, 42 and 43 according to arrows P2, K2a, K2b, P3, K3a and K3b. Accordingly, when the carriers are loaded as evenly as possible and a carrier is secured to each chain link, the forces on the connecting pins of the chain 4 can, in an ideal situation, compensate for one another completely or at least partially, thereby stabilising the "rack packet" and taking the load off the chain 4 and the chain guideway so that their service life can be increased.

Figure 11:
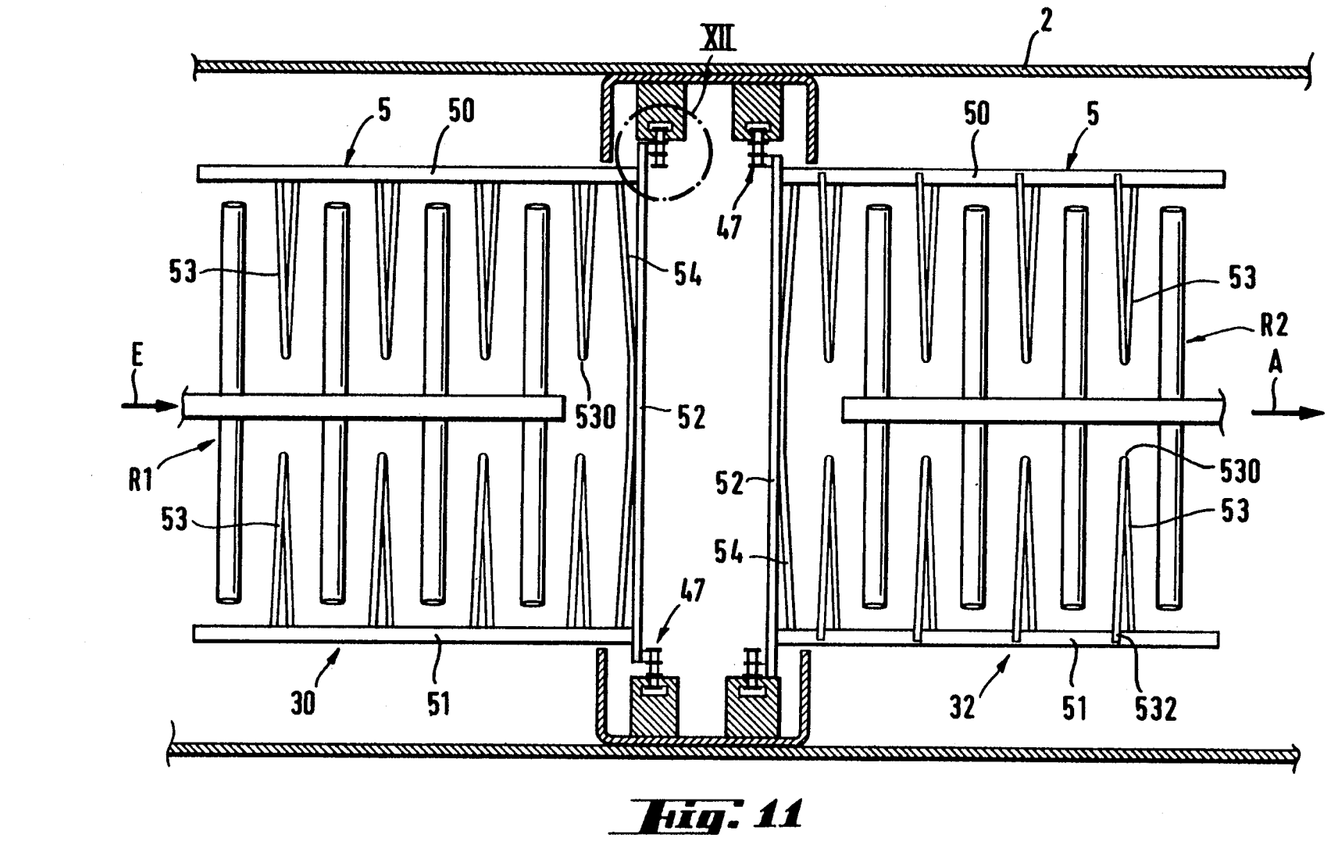
FIG. 11 is a view according to the line XI—XI of FIG. 1.
Figure 12:
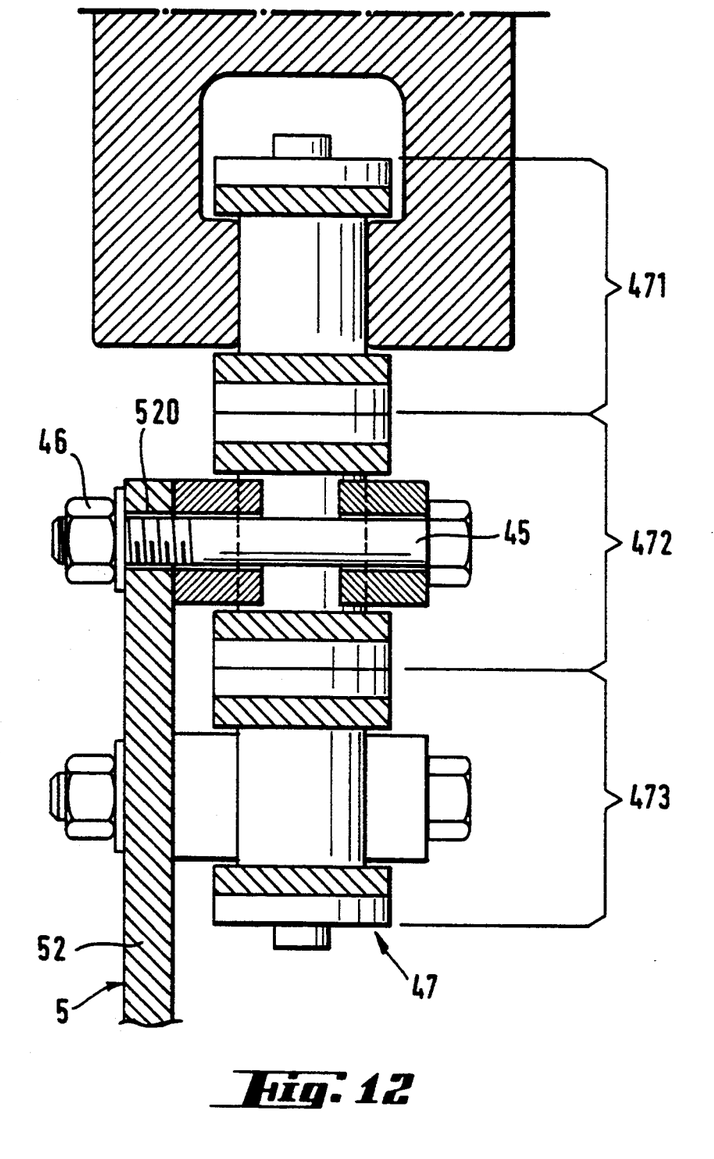
FIG. 12 shows the detail XII—XII of FIG. 11 on an enlarged scale.

FIG. 11 shows a view according to the line XI—XI in FIG. 1 in which the chain 4 with carriers 5 is shown in plan view, a carrier 5 being connected to each individual chain link. In the embodiment described, the individual carriers 5 are secured, for example, by means of threaded pins 45 and nuts 46 to the chain 4. For that purpose, there are provided in the connecting strips 52 drill-holes 520 and 521 (FIG. 4) through which the threaded pins 45 are pushed and are secured to the chain 4 by means of the nuts 46. That manner of fastening is shown in FIG. 12, which shows the detail XII of FIG. 11 on an enlarged scale. In addition, that Figure also shows that the transport path comprises two triplex chains 47. Such a triplex chain 47 comprises three interconnected link conveyors 471, 472 and 473 running parallel to one another, the individual link conveyors being securely connected to one another by connecting pins. The outermost link conveyor 471 circulates in a guideway and is used only for conveying and driving purposes. The carriers 5 are secured to the other two link conveyors 472 and 473. The carriers 5 are always secured in alternating manner to the middle link conveyor 472 of the one triplex chain and to the innermost link conveyor 473 of the other chain. In FIG. 12, the carrier 5 is secured to the illustrated triplex chain 47 at the middle link conveyor. At the other triplex chain (not shown), it is accordingly secured to the innermost link conveyor 473. In order to permit that alternating fastening to the triplex chains 47, the carrier following the carrier shown in FIG. 4 is in the form shown by the broken line, that is to say, the following carrier is slightly longer at the one end and has there the drill-hole 522 for securing the carrier to the triplex chain. Accordingly, it is slightly shorter at the other end and is there provided with the drill-hole 523 for securing the carrier to the triplex chain. That alternating fastening of the carriers to the triplex chains 47 is advantageous with regard to a high packing density because, with a high packing density, carriers must, if possible, be secured to all of the chain links. When a chain link then passes into the region of a turning point, the one carrier and the chain link must be turned round together, while the following chain link does not have to be turned round quite yet. To make that possible and in order that the carriers do not obstruct one another, the proposed manner of securing the carriers to the triplex chains is especially advantageous. In addition, that type of fastening to the triplex chains permits a favourable distribution of the forces acting on the chain, as already explained above. In order to achieve this, the triplex chain can of course also be replaced by a special chain that permits a carrier to be secured between each pair of bolts of the special chain.

The continuous drier described is suitable especially for drying printed circuit boards that have been coated on one side or on both sides, for example with a solder varnish. The board can at the same time be subjected to vapour-removal in that drier because the period of dwell in the drier is relatively great. As a result, it is not necessary to have a separate vapour-removal station. Of considerable advantage is the comparatively short path of the drying air over the individual boards to be dried. In addition, the airstream is very even, which means that the individual boards are dried evenly and well. A further advantage is that a high packing density of boards to be dried can be achieved, this being rendered possible, especially, by the advantageous construction of the carriers on the one hand and, on the other, by their fastening and transport by means of the triplex chains. A further advantage is obtained by the division of the drier housing into several temperature zones, so that the board can be slowly heated and cooled again. That is advantageous especially with regard to ensuring careful treatment of the board material. It is, however, also advantageous with regard to reducing energy consumption as compared with known driers, of which the energy consumption for heating the drying air is considerably higher than the consumption of the drier according to the invention.

What is claimed is:

1. A continuous drier for flat piece material comprising:
   a heatable drier housing and a transport path that ascends in said drier housing and, after passing an upper turning point, descends again,
   said transport path comprising an endless chain that extends substantially vertically and to which are secured carriers for said piece material to be transported,
   said carriers projecting outwards from said endless chain, wherein each of said carriers are secured to links of said chain, each of said carriers comprising two lateral bars, each of said bars having an upper and a lower side and a base end facing said chain, said bars being connected at said base ends by a connecting strip, and wherein there are secured to said lateral bars substantially V-shaped carrying members, of which the vertices point approximately in the direction of the other lateral bar, and, of the two ends of said V-shaped carrying members, one is secured to said upper side and the other is secured to said lower side of the associated lateral bar,
   said drier further comprising a supply duct for drying air for said piece material to be dried, wherein said supply duct is so arranged that an airstream supplied by it flows over said piece material transversely to the direction in which said carriers project from said chain.

2. A continuous drier according to claim 1, wherein said supply duct is arranged laterally adjacent to said transport path for said piece material and is integrated in said drier housing.

3. A continuous drier according to claim 1, wherein said airstream is conveyed over said piece material to be dried through slots formed between consecutive carriers.

4. A continuous drier according to claim 1, wherein a carrier is secured to each link of said chain and wherein each of said two lateral bars of said carrier has an approximately U-shaped profile, each of the arms of said U having an outer and an inner wall and said arms of said U pointing towards the other bar, and wherein one end of said carrying member is secured to the outer wall of one arm of said U and the other end is secured to the inner wall of the other arm of said U of the lateral bar concerned, the width of said lateral bars together with the thickness of said carrying members not exceeding the length of a link of said chain.

5. A continuous drier according to claim 1, wherein the transport path comprises two triplex chains each of which comprises three interconnected link conveyors circulating parallel to one another, the outermost link conveyor circulating in a guideway and, at the other two link conveyors, said carriers being connected in an alternating manner to the middle link conveyor of the one triplex chain and, at the same time, to the innermost link conveyor of the other triplex chain.

6. A continuous drier according to claim 1, wherein support strips for said piece material are arranged near said base ends of the lateral bars and wherein each strip extends between two consecutive lateral bars of two carriers to the associated, opposite lateral bars.

7. A continuous drier according to claim 1, wherein several zones are provided in said drier housing, which are heated to different temperatures and are thermally separated from one another, and a separate supply duct for drying air is provided in each temperature zone.

8. A continuous drier according to claim 7, wherein said temperature zones comprise a first, pre-heating zone in a first portion of said transport path, in which zone the temperature is in the range of approximately from 30° C. to 70° C., and the temperature in a subsequent, hot-air zone is in the range of approximately from 80° C. to 110° C. and, in a final, cooling zone, is in the range of approximately from 15° C. to 30° C.

9. A continuous drier according to either claim 7, wherein said temperature zones are separated from one another by separating walls that extend from the lateral body of said housing as far as said lateral bars and are provided with lip-like seals past which said lateral bars of said carriers are conveyed.

10. A continuous drier according to claim 1, wherein said flat piece material comprises a liquid-coated printed circuit board.

* * * * *